(12) United States Patent
Lenz et al.

(10) Patent No.: US 7,884,583 B2
(45) Date of Patent: Feb. 8, 2011

(54) SPEED RECOGNITION FOR HALF BRIDGE CONTROL

(75) Inventors: Michael Lenz, Zorneding (DE); Andrei Covalenco, Causeni (MD); Dan Dinu, Bucharest (RO)

(73) Assignee: Infineon Technologies Austria AG, Villach (AT)

( * ) Notice: Subject to any disclaimer, the term of this patent is extended or adjusted under 35 U.S.C. 154(b) by 403 days.

(21) Appl. No.: 12/165,262

(22) Filed: Jun. 30, 2008

(65) Prior Publication Data

US 2009/0322407 A1    Dec. 31, 2009

(51) Int. Cl.
*G05F 1/10* (2006.01)
*G05F 1/652* (2006.01)

(52) U.S. Cl. .................. 323/222; 323/223; 323/224; 323/282; 323/284; 323/285

(58) Field of Classification Search ................. 323/222, 323/223, 224, 282, 284, 285
See application file for complete search history.

(56) References Cited

U.S. PATENT DOCUMENTS

| | | | | |
|---|---|---|---|---|
| 6,348,780 B1* | 2/2002 | Grant | ......................... | 323/222 |
| 7,057,380 B2* | 6/2006 | Kuo et al. | .................. | 323/284 |
| 7,679,346 B2* | 3/2010 | Lin et al. | ..................... | 323/282 |
| 7,782,036 B1* | 8/2010 | Wong et al. | ................. | 323/282 |
| 7,795,851 B2* | 9/2010 | Ye et al. | ..................... | 323/282 |
| 2004/0037097 A1 | 2/2004 | Deng et al. | | |
| 2004/0239300 A1* | 12/2004 | Sutardja et al. | ............. | 323/283 |
| 2010/0117612 A1* | 5/2010 | Klootwijk et al. | ........... | 323/282 |

FOREIGN PATENT DOCUMENTS

| | | |
|---|---|---|
| DE | 10 2005 016 440 A1 | 10/2006 |
| EP | 1 876 693 A1 | 1/2008 |
| WO | WO 03/077322 A2 | 9/2003 |

* cited by examiner

*Primary Examiner*—Bao Q Vu
(74) *Attorney, Agent, or Firm*—Slater & Matsil, L.L.P.

(57) ABSTRACT

Circuit and method for controlling a high bridge circuit with increased efficiency is disclosed. Circuitry is provided outputting gating signals to a high side driver and a low side driver responsive to a time varying input signal. A frequency measurement circuit determines a high speed mode when the input signal is at a frequency above a threshold, and the gating signal to the high side driver is inhibited. When the input signal frequency is below the threshold, the low side driver and the high side driver gating signals switch alternately. In an exemplary implementation, the frequency measurement circuit is provided as two counters outputting signals to a decision circuit which controls the half bridge circuit. Methods are provided for efficiently providing gating signals to the drivers of a half bridge circuit based upon the frequency of the input signal.

31 Claims, 4 Drawing Sheets

SPEED RECOGNITION FOR HALF BRIDGE CONTROL

TECHNICAL FIELD

The present invention relates generally to a system and method to improve the operation of a high half bridge driver circuit such as used in driving inductive loads as motors, for power supply circuits, synchronous rectifier circuits, and the like, and more particularly to a system and method for efficient operation of a half bridge circuit using a low speed mode and a high speed mode.

BACKGROUND

Generally, a half bridge circuit is provided to drive an inductive load. Inductive loads that require supplied current include motors, coils, valves, and the like. Certain DC converters and switching rectifier topology circuits are also driven by a half bridge. The half bridge circuit provides a high side driver, typically a MOS driver transistor, coupled between a supply and a load output and having a high side gating control signal. The half bridge also provides a low side driver, also typically a MOS driver transistor, coupled between the load output and a ground terminal and having a low side gating control signal. In most applications, a time varying input signal is provided, which is a switching signal. In some applications, this signal may be a pulse width modulated but fixed frequency switching signal. In other applications, this input signal may be a pulse frequency modulated input signal that has a variable frequency and a constant or variable duty cycle. In any case, as the load requires current, switching signals at the input are used to determine the gating signals needed at the high and low side drivers. Because the load is inductive, the switches must also provide a discharge current path from the inductor when the high side driver is switched off. Also, a "dead time" is needed between cycles so that the low and high side driver are never both active, as that creates a "shoot through" current path through the driver transistors from the supply voltage to ground, creating inefficiency and power loss.

In order to achieve proper current regulation in the inductive load, it is necessary to switch between the high side driver "on" and the low side driver "on". The requirement that a "dead time" be maintained between the high side driver on and the low side driver on cycles places a limit on the switching speed of the circuit. Further, the circuitry used to create the "dead time" is unreliable and may, in certain circumstances, allow the "shoot through" current to occur, even if the circuitry was designed not to do so.

A continuing need thus exists for an efficient and reliable circuit and methods to control the switching operations of a half bridge circuit driving an inductive load.

SUMMARY OF THE INVENTION

These and other problems are generally solved or circumvented, and technical advantages are generally achieved, by preferred embodiments of the present invention which provide an efficient and reliable method to operate the low side and high side drivers of a half bridge circuit. The following summary is not an exclusive list of embodiments and is not limiting of the embodiments or scope of the appended claims.

In an exemplary embodiment, a method comprises providing a high side driver coupled between a positive voltage supply and an output, responsive to a high side gating signal; providing a low side driver coupled between the output and a ground terminal responsive to a low side gating signal; determining whether a received time varying input signal has a frequency greater than a predetermined threshold and setting a fast state flag if the threshold is exceeded; outputting the low side gating signal with a first polarity as alternating pulses responsive to transitions in the input signal; if the fast state flag is set, inhibiting the high side gating signal so that the high side driver is maintained in an off condition; and if the fast state flag is not set, outputting the high side gating signal as alternating pulses of a second polarity opposite the first polarity, responsive to transitions in the input signal.

In another exemplary embodiment, a half bridge circuit for driving an inductive load is provided, comprising a high side driver coupled between a positive power supply and an output terminal responsive to a high side gating signal; a low side driver coupled between an output terminal and a ground terminal responsive to a low side gating signal; a high side gating signal driver coupled to a control circuit for providing alternating pulses on the high side gating signal of a first timing polarity; a low side gating signal driver coupled to the control circuit for providing alternating pulses on the low side gating signal of a second timing polarity opposite the first timing polarity; circuitry configured to determine whether the frequency of a time varying input signal is greater than a predetermined threshold, and outputting a fast state flag; control circuitry configured to enable the low side gating signal driver to output alternating pulses corresponding to transitions in the input signal; if the fast state flag is set, the control circuitry further configured to inhibit the high side gating signal driver from outputting pulses to the high side driver; and if the fast state flag is not set, the control circuitry further configured to enable the high side gating signal driver to output alternating pulses corresponding to transitions in the input signal.

In another exemplary embodiment, a method for controlling a half bridge circuit including a high side driver coupled between a positive voltage supply and an output terminal and having a reverse current conduction path, and a low side driver coupled between the output voltage supply and a ground reference, where the method comprises determining whether a time varying input signal has a frequency that exceeds a predetermined threshold, and setting a fast state flag if the threshold is exceeded; responsive to transitions in the input signal, outputting a low side driver gating signal to control the low side driver, the low side driver gating signal being an alternating signal of a first timing polarity; if the fast state signal is set, outputting a value on a high side gating signal to control the high side driver to put the high side driver in an off condition; and if the fast state signal is not set, responsive to transitions in the input signal outputting a high side driver gating signal to control the high side driver, the high side driver being an alternating signal of a second timing polarity.

In yet another exemplary embodiment, a half bridge controller integrated circuit is provided comprising circuitry adapted to output an alternating high side gating control signal of a first timing polarity for connection to a high side driver, responsive to transitions in a time varying input signal; circuitry adapted to output an alternating low side gating control signal for connection to a low side driver, the low side gating control signal of a second timing polarity opposite to the first timing polarity responsive to transition in the time varying input signal; circuitry adapted to determine whether the frequency of the time varying input signal exceeds a threshold, and setting a fast state flag if the threshold is exceeded; circuitry adapted to inhibit the high side gating control signal if the fast state flag is set; and circuitry adapted to enable the high side gating control signal if the fast state flag is not set.

BRIEF DESCRIPTION OF THE DRAWINGS

For a more complete understanding of the present invention, and the advantages thereof, reference is now made to the following descriptions taken in conjunction with the accompanying drawings, in which.

The figures are presented to enhance comprehension of the embodiments and are representative, are not drawn to scale, and are not limiting with respect to the embodiments, the invention or the appended claims.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, the control circuitry for a half-bridge driver circuit. This circuit may be used to drive inductive loads such as motors, stepping motors, coils, valves and the like. The circuit may be used in a DC converter or power supply application to provide a DC output at a load from a DC input. Generally, the control circuit provides gating signals to a pair of driver devices in response to a time varying input signal, and thereby controls the energy delivered from a power supply to a load coupled between the two drivers.

Figure 1:
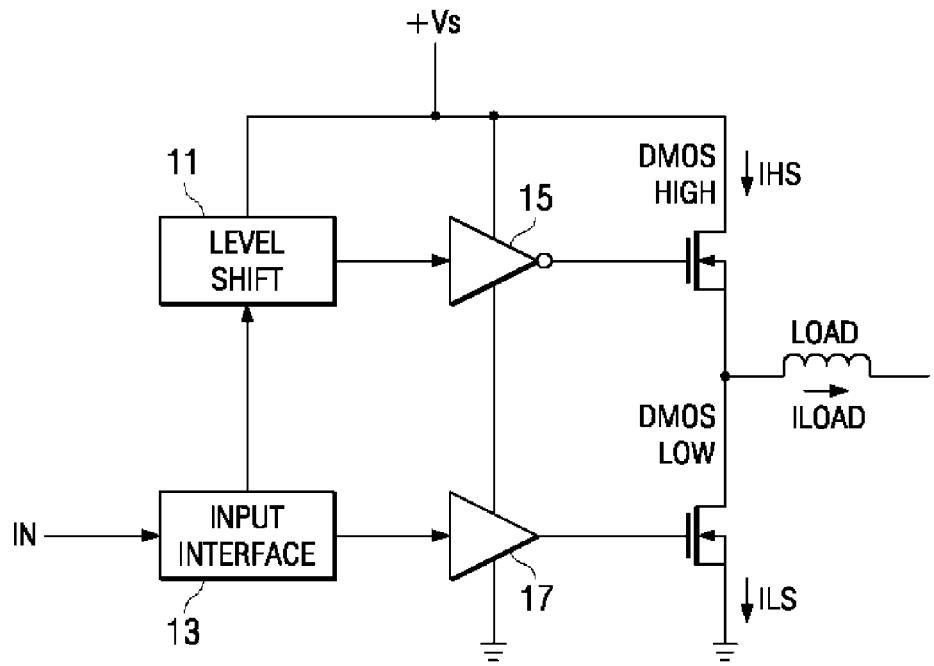
FIG. 1 illustrates a simplified half bridge circuit topology.

In FIG. 1, a conventional half bridge circuit is illustrated. A high side driver device, here shown as a DMOS driver referenced as DMOS High, is coupled between a positive supply voltage +Vs and an output node where an inductive load referenced as LOAD is coupled. A low side driver device, here shown as a DMOS driver referenced as DMOS Low, is shown coupled between the output where LOAD is coupled and a ground reference. Gate driver 15, here shown as an inverting buffer, although other devices could be used, provides the gating control signal to DMOS High. Similarly, gate driver 17, shown as a non-inverting buffer, provides the gating control signal to DMOS Low. When the respective gating control signal is high or ON, the respective driver DMOS High or DMOS Low couples its current conduction path from the power supply to the output terminal. As can be seen from the figure, if both the drivers are ever ON at the same instant, a current called a "shoot through" current will flow through both DMOS drivers from the positive supply to ground. This situation should be avoided so as to provide efficient operation and to prevent possible damage to the driver devices.

A time varying signal IN is received at the input interface 13. The application the half bridge circuit is finally used in will dictate the actual characteristics of this signal. Generally, the signal will be varied in frequency to control the energy delivered into the load from the positive voltage supply. In a voltage converter application, feedback circuitry from the output and a voltage compare reference may be used, for example, to determine the frequency the IN signal should switch. The frequency of the IN signal will increase or decrease to deliver less, or more, energy into the load.

The input signal is input to a level shift function 11 for providing the gating signal to the high side driver DMOS High. This is necessary to get the gate of the DMOS driver at least a turn-on voltage threshold above the supply voltage +Vs. If different drivers are used, for example a PMOS high side driver, the level shifter may not be necessary. The use of DMOS drivers to provide the driving function is advantageous and is typical, as is known in the art.

In operation, the gating signals controlling the high and low side drivers will switch in response to and generally corresponding with the input signal IN. As can be seen by the opposite polarities of buffers 15 and 17, the high side gating signal output by gate driver 15 will be opposite to the input signal IN, while the low side driver 17 will be of same polarity as IN. This arrangement could be vice versa, so long as the driver gating signals are of opposite timing polarity.

Figure 2:
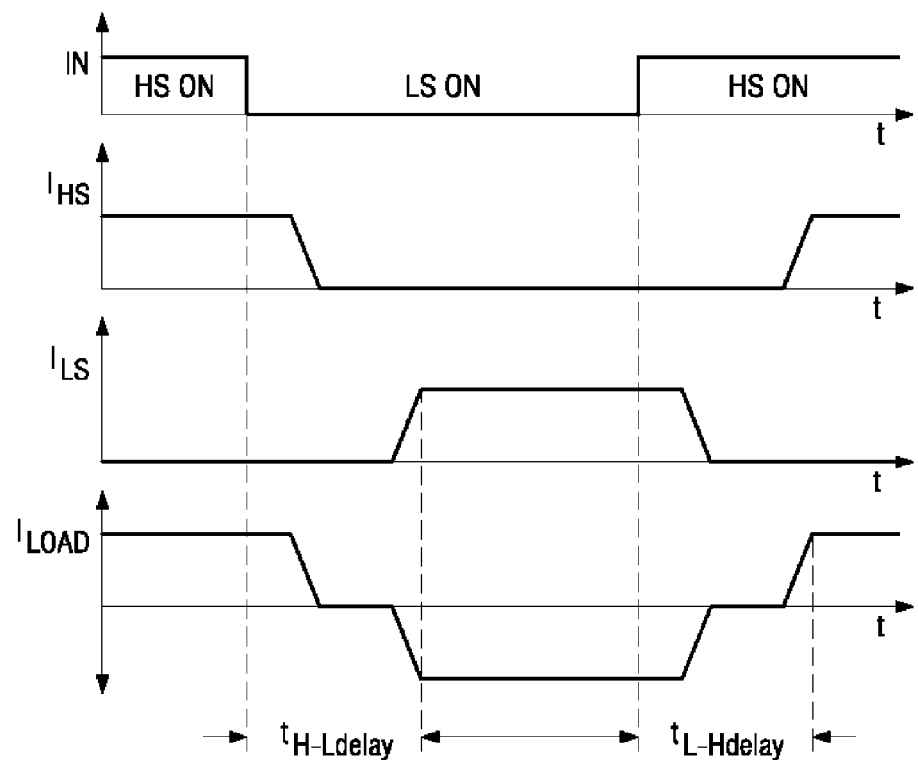
FIG. 2 is a timing diagram for the circuit of FIG. 1.

FIG. 2 is a timing diagram showing the operation of the half bridge circuit of FIG. 1. The top trace depicts times when the high side driver is ON and times when the low side driver is ON with respect to the IN signal after it is input to interface 13. When the high side driver DMOS High is on, current IHS can flow from the positive supply +Vs into LOAD. Thus the current $I_{LOAD}$ is positive during these times. Conversely, when the low side driver is ON, current can flow out from the inductive load through the low side driver into the ground terminal. Thus when the low side driver is on, the timing diagram shows that the load current $I_{LOAD}$ becomes negative (flowing back into the half bridge driver circuit and out of the load). By controlling how the current flows into and out of the inductive LOAD, the driver gating signals determine how much energy is transferred.

The transition times $t_{H\text{-}L\ delay}$ and $t_{L\text{-}H\ delay}$ indicated in FIG. 2 are important. Delay $t_{H\text{-}L\ delay}$ is the time between the instant current is flowing in the high side driver to the instant the current is flowing in the low side driver. These delays are created by the control circuit to create the necessary "dead time" to prevent shoot through current from flowing through the high and low side drivers to ground. This delay is quite large, and prevents the gating signals from the high and low side gate drivers 15 and 17 from directly tracking transitions in the input, especially at higher frequencies of the input signal.

Figure 3:
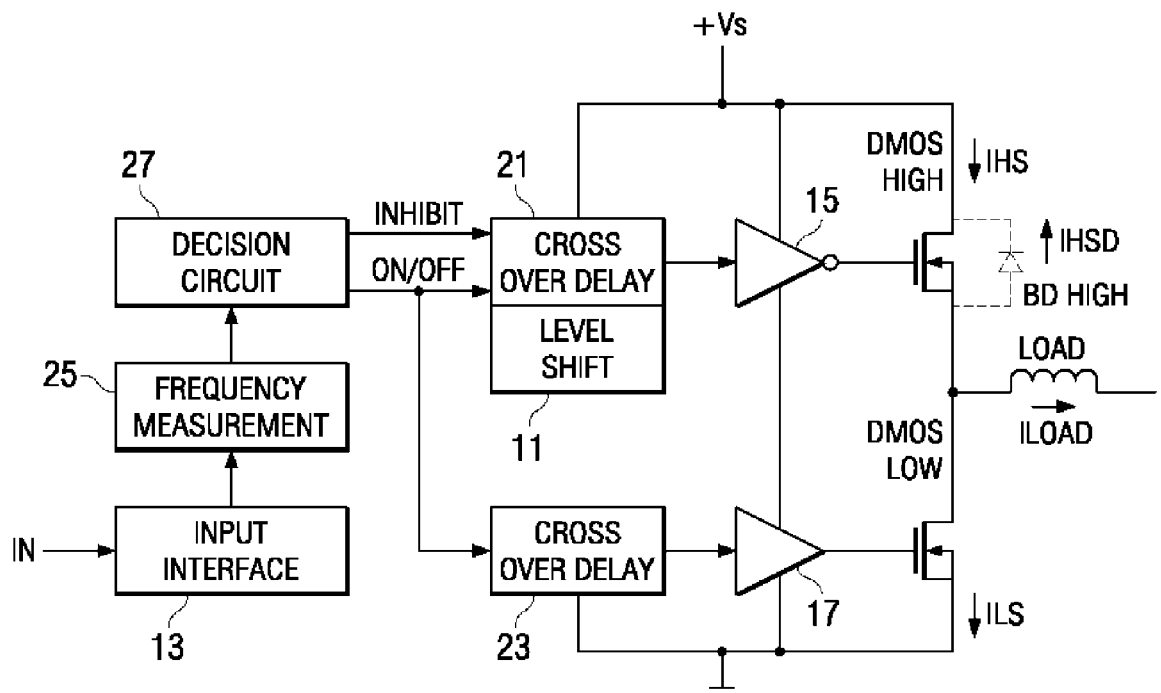
FIG. 3 illustrates an exemplary circuit embodiment of the half bridge circuit of the invention.

A first exemplary circuit embodiment of the invention is depicted in FIG. 3. In FIG. 3, the topology for a half bridge circuit includes a frequency measurement circuit 25 and a decision circuit 27 that outputs an inhibit signal and an ON/OFF switching signal. Cross over delay circuits 21 and 23 are coupled to the inputs of the gate drivers 15 and 17. The remaining elements of the drivers DMOS High and DMOS Low, the load LOAD, and the power and ground terminals are as before.

The circuit embodiment of FIG. 3 takes advantage of a phenomenon that, as the input signal IN switching frequency increases, there is no need to supply current into the load from the high side driver. Instead the load is sending current back into the control circuit. When the low side driver is OFF, the parasitic body diode of the high side driver DMOS High, labeled "BD High", will provide a current conduction path from the output node back to the positive supply. This current flows during high frequency operations when the load device does not require current.

The frequency measurement and decision circuits 25 and 27 of the half bridge of FIG. 3 provide two modes of operation. In a low frequency "on/off switching mode", the gating signals provided to the drivers by gate drivers 15 and 17 will be more or less as shown in FIG. 2, the ON/OFF signal will track the input signal IN. The gate drivers, having opposite polarity will output alternate on and off (or off and on) signals to the high and low side drivers DMOS High and DMOS Low. The cross over delay elements 21 and 23 will ensure that there is sufficient "dead time" between the active times for the DMOS drivers in this mode, to prevent shoot through current.

However, when the frequency measurement circuit 25 indicates that the input signal IN is switching at a frequency higher than a predetermined threshold, the decision circuit will operate the half bridge circuit in a "low side only" switching mode or fast state mode. Signal "inhibit" will shut down the ON/OFF signal to the gate driver 15, so that the high side driver DMOS High remains off. The body diode BD High will continue to provide a current path from the output. The low side driver will then be switched on and off in a "chopper" mode, providing a current discharge path to ground from the output in alternating ON/OFF cycles. The gating signals to the low side driver will track the transitions of the input signal IN. The dead time delay is not needed in this mode, so the low side switching can better track the input signal transitions. As a result the cross over delay functions may be disabled in the fast state mode, the low side driver will switch according to its own internal delay responsive to transitions in the input signal without any further delays. The cross over delay circuits 21 and 23 may feature, for example, an input coupled to the inhibit signal, or a bypass multiplexer or other arrangement to prevent the cross over delay from occurring in the low side switching mode.

Figure 4:
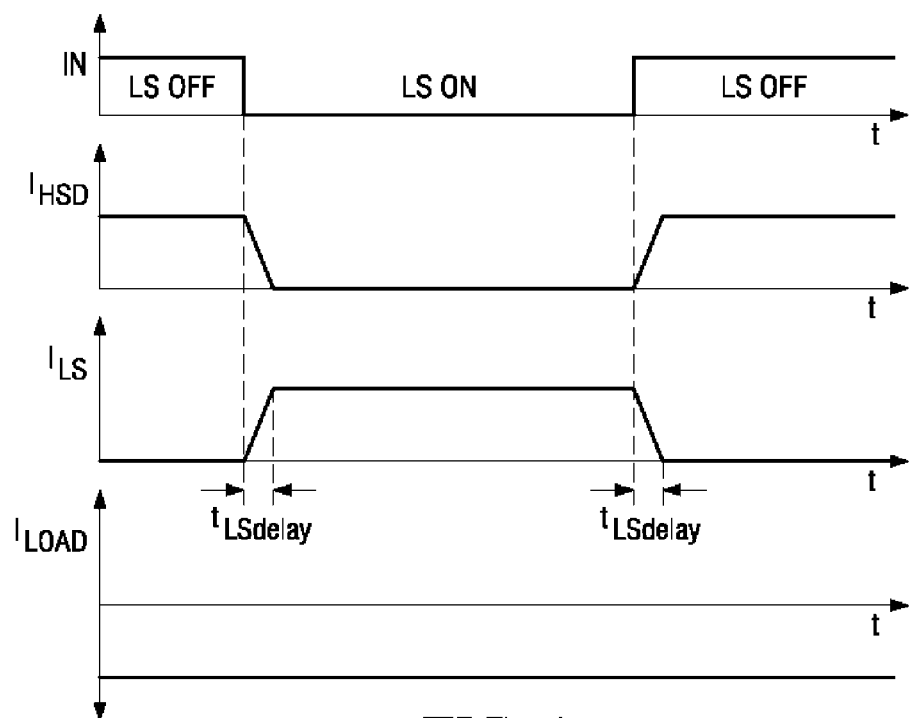
FIG. 4 illustrates a timing diagram of the embodiment of FIG. 3 in an exemplary mode of operation.

FIG. 4 illustrates the timing of signals in the low side switching mode. The trace labeled IN shows the input signal voltage over time. The trace labeled $I_{HSD}$ shows current flowing into the body diode BD High during the low side OFF times. The trace labeled $I_{LS}$ shows the current flowing through the low side driver, into ground, during the low side driver ON times. The trace labeled $I_{LOAD}$ depicts the current flowing from the load into the half bridge circuit (this current is negative, as the load is not receiving energy when the input signal IN is switching at high frequencies).

The threshold frequency for determining when the half bridge circuit is operating in low frequency or "ON/OFF" mode, versus when it is operating in high frequency or "low side only" mode, is a design choice. In an exemplary example, low frequency mode was set to be around 10 Khz-15 Khz or less, and high frequency mode was set to be above that threshold. Likewise, the supply voltage +Vs, the size and type of the DMOS drivers, and the load, are also dictated by design choices.

In FIG. 4, the delay time $t_{LS\ delay}$ from the low side driver OFF to the low side driver ON is determined by the switching speed of the driver, and no "dead time" is needed. Thus, performance is improved because the low side switching can better track the input signal transitions.

Figure 5:
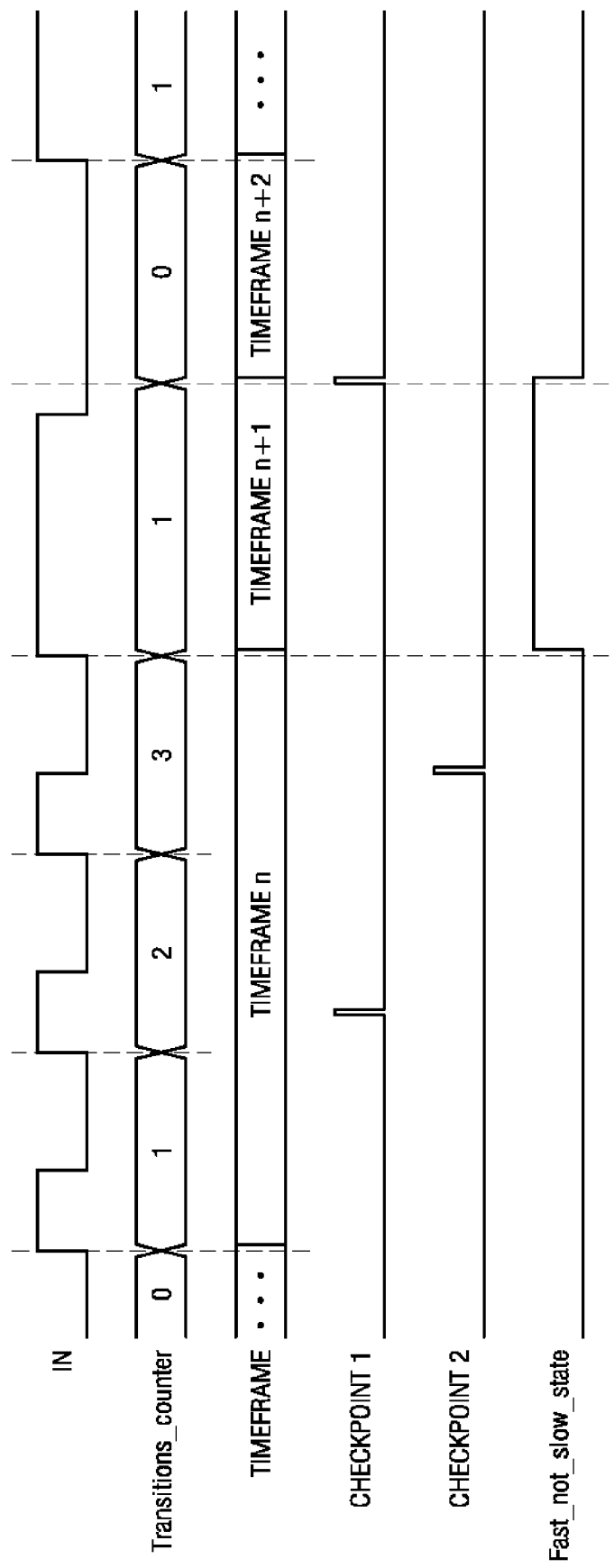
FIG. 5 illustrates certain signals of an exemplary embodiment of certain circuits in the embodiment of FIG. 3 in a timing diagram.

FIG. 5 depicts an exemplary timing diagram for one possible implementation of the frequency measurement circuit 25 of FIG. 3. In FIG. 5, a signal Fast_not_slow_state is low in the on/off switching mode. If this Fast_not_slow_state signal is high, then a higher frequency input signal has been detected (above the frequency threshold). The trace labeled IN depicts the voltage on the input signal over time. The trace labeled Transitions_counter depicts the output value of a counter. The trace labeled Timeframe depicts the beginning and end of certain timeframes. The traces labeled Checkpoint 1 and Checkpoint 2 indicate when portions of a timeframe period have elapsed, in this example ⅓ for Checkpoint 1 and ⅔ for Checkpoint 2.

In operation, at the beginning of the timing diagram, the Fast-not_slow_state signal is not set, and the Transitions_counter and Timeframe are both reset. The Transitions_counter is incremented at each rising edge of the IN signal during a single timeframe. If the decision circuit detects three or more rising transitions during a timeframe, the Fast_not_slow_state is set, indicating the frequency of the input signal was found to be above the threshold. The Transitions_counter and timeframe are then reset.

In order to quickly detect a falling frequency in the input signal after the Fast_not_slow_state is set, the Checkpoint signals are used. If the first checkpoint signal Checkpoint 1 is true and the transitions counter is less than 2, or if the second checkpoint signal Checkpoint 2 is true and the transitions counter is less than 3, or if the timeframe counter reaches the limit without the transition counter reaching 3 then the Fast_not_slow_state will be reset (indicating the lower frequency input signal and on/off switching mode) and both counters are reset.

In FIG. 5, once the trace Fast_not_slow_state shows the signal is set, the timeframe n+1 illustrates a case where the input signal IN rapidly slows in frequency. At the first checkpoint indicated by Checkpoint 1 (in this non limiting example, ⅓ portion of the timeframe period) only 1 transition has been counted by the Transitions_counter. The flag Fast_not_slow_state is then reset, as are both the timeframe and Transitions_counters. Thus, the decision circuit can determine from the counters and checkpoint signals that the half bridge should return to the on/off mode, switching both the high and low side drivers ON and OFF. In timeframe n+2 of FIG. 5, the decision cycle begins again.

Figure 6:
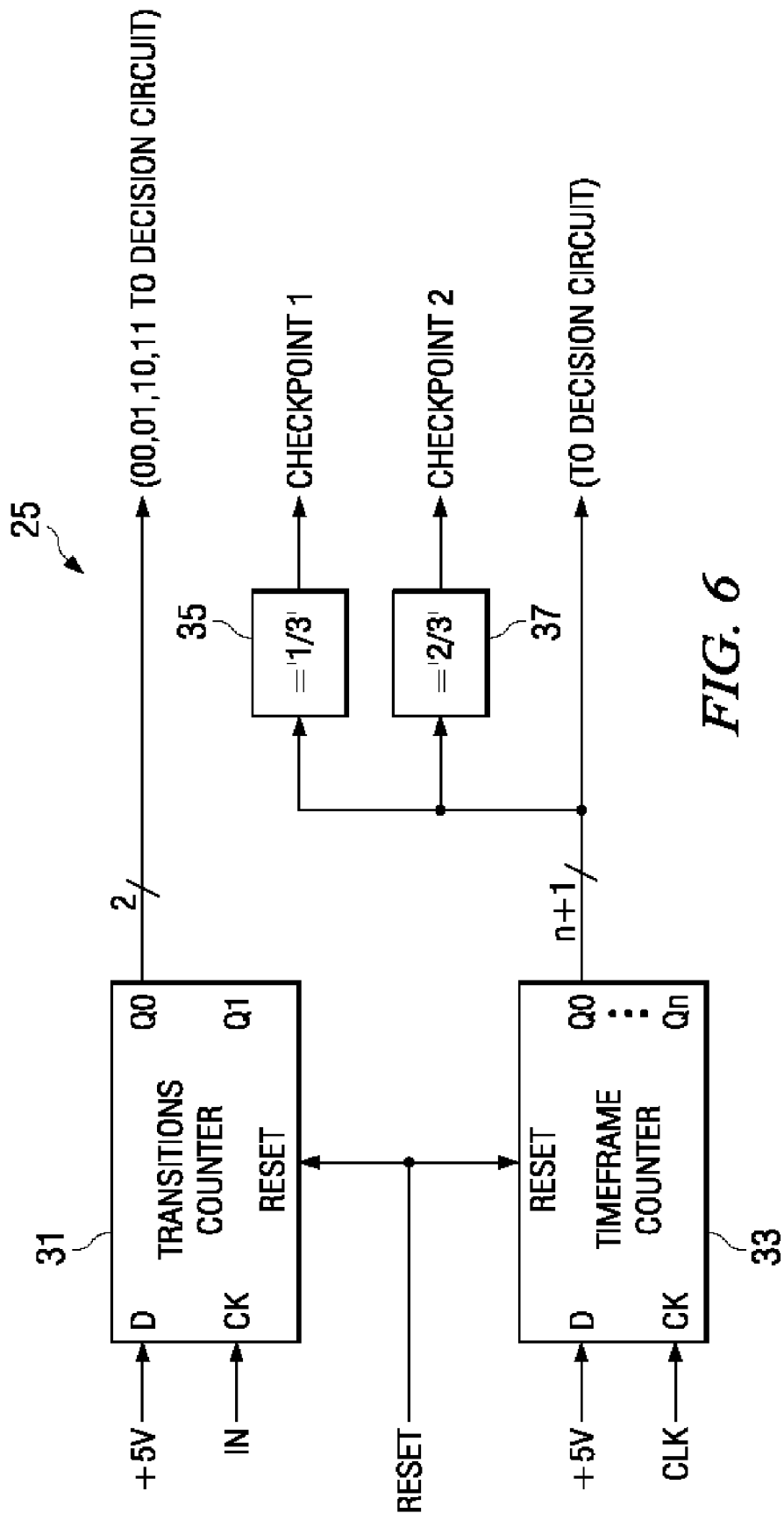
FIG. 6 depicts in a simplified block diagram a possible implementation of certain circuits of the embodiment of FIG. 3.

FIG. 6 is an exemplary embodiment for the transitions counter and the timeframe counter used in one embodiment of the circuit of FIG. 3. Although other similar implementations could be used; these alternatives are contemplated as embodiments and are within the scope of the appended claims. In FIG. 6, transitions counter 31 is shown implemented as an incrementing counter that is reset by an input from the decision circuit 27 (not visible). Although the number of transitions to be counted is flexible, in this example embodiment, a 2 bit counter is used to count up to 3 transitions in a timeframe. The timeframe counter 33 may also be determined as a design choice depending on the clock signal used and the threshold frequency desired. The number of bits of the timeframe counter is varied to obtain the frequency resolution required. In this example, a 7 bit counter was chosen. The decision circuit also needs to have information about when a portion of the timeframe has elapsed, so signals Checkpoint 1 and Checkpoint 2 are output to the decision circuit by comparators 35 and 37. Checkpoint 1 indicates ⅓ of the timeframe is complete. Checkpoint 2 indicates ⅔ is complete.

The decision circuit 27 may be implemented as a state machine, sequential logic machine, microcontroller or other logic circuitry. When the half bridge is operating in the "low side only" or high frequency mode, the decision circuit inhibits the high side using the "inhibit" signal. The decision circuit then checks the transition count and checkpoint information to quickly detect if the input signal IN slows down; if so, the decision circuit will reset the counters, reset the flag and return to the "on/off" mode. In on/off mode, the control circuit releases the high side gating signal to allow the high side driver to switch ON and OFF with the transitions in the input signal.

If the half bridge is operating in the low speed mode, the decision circuit 27 will continue to check the transitions counter for 3 or more transitions in a timeframe and if detected, will set the flag Fast_not_slow_state to indicate the circuit is in high speed or "low side only" mode.

The exemplary embodiment half bridge circuit of FIG. 3 could be implemented in several ways. Non limiting examples include implementing the half bridge as a circuit on a circuit board, as a stand alone IC, as an ASIC or semi-custom device, in off the shelf integrated circuitry, or integrated either with the controller IC that develops the PWM signal, or with the driver transistors, or some other arrangement including part of the circuitry in an IC or discrete devices could be used. In one exemplary embodiment the gate drivers 15 and 17, the cross over delay circuits 21 and 23, the level shifter 11, the decision circuit 27 and the frequency measurement circuit 25 could be conveniently integrated into a half bridge controller IC, while external drivers DMOS High and DMOS Low could be used; allowing the designers of the application's circuitry to select the drivers most appropriate for particular loads. The decision circuit could be implemented in software, hardware, or a combination of these.

Although the present invention and its advantages have been described in detail, it should be understood that various changes, substitutions and alterations can be made herein without departing from the spirit and scope of the invention as defined by the appended claims. For example, although differential operational amplifier circuits are shown in some embodiments, known circuit design alternatives could be used to implement the functions.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method, comprising:
providing a high side driver coupled between a positive voltage supply and an output responsive to a high side gating signal;
providing a low side driver coupled between the output responsive to a low side gating signal;
determining whether a received time varying input signal has a frequency greater than a predetermined threshold and setting a fast state flag if the threshold is exceeded;
outputting the low side gating signal with a first polarity as alternating pulses responsive to transitions in the input signal;
if the fast state flag is set, inhibiting the high side gating signal so that the high side driver is maintained in an off condition; and
if the fast state flag is not set, outputting the high side gating signal of a second polarity opposite the first polarity responsive to transitions in the input signal.

2. The method of claim 1, wherein providing the high side driver further comprises providing a driver with a reverse current conduction path when the driver is in an off condition.

3. The method of claim 1, wherein determining whether a received time varying input signal has a frequency greater than a predetermined threshold further comprises:
defining a timeframe that is a time period;
counting transitions in the input signal during the timeframe;
determining if the input signal has more than a first predetermined number of transitions during the timeframe; and
if the predetermined number of transitions is exceeded, setting the fast state flag.

4. The method of claim 3, wherein counting transitions further comprises incrementing a counter.

5. The method of claim 3, and further comprising:
if the fast state flag is set, defining a timeframe that is a time period;
counting transitions in the input signal during a first portion of the timeframe; and
if the number of transitions is less than a second predetermined number of transitions that is less than the first predetermined threshold during the first portion, clearing the fast state flag.

6. The method of claim 5, and further comprising:
counting transitions in the input signal during a second portion of the timeframe; and
if the number of transitions is less than a third predetermined number of transitions that is greater than the second predetermined threshold during the second portion, clearing the fast state flag.

7. The method of claim 1, wherein outputting the low side gating signal with a first polarity as alternating pulses responsive to transitions in the input signal further comprises providing a delay from transitions in the input signal to outputting the low side gating signal.

8. The method of claim 2, wherein providing the high side driver comprises providing a DMOS transistor.

9. The method of claim 8, wherein providing the DMOS transistor comprises providing the DMOS transistor with the body diode of the DMOS transistor providing the current conduction path when the DMOS transistor is in the off condition.

10. A half bridge circuit for driving an inductive load, comprising:
a high side driver coupled between a positive power supply and an output terminal responsive to a high side gating signal;
a low side driver coupled between output terminal and a ground terminal responsive to a low side gating signal;
a high side gating signal driver coupled to a control circuit for providing alternating pulses on the high side gating signal of a first timing polarity;
a low side gating signal driver coupled to the control circuit for providing alternating pulses on the low side gating signal of a second timing polarity opposite the first timing polarity;
circuitry configured to determine whether the frequency of a time varying input signal is greater than a predetermined threshold, and outputting a fast state flag;
the control circuitry configured to enable the low side gating signal driver to output alternating pulses corresponding to transitions in the input signal;

if the fast state flag is set, the control circuitry further configured to inhibit the high side gating signal driver from outputting pulses to the high side driver; and if the fast state flag is not set, the control circuitry further configured to enable the high side gating signal driver to output alternating pulses corresponding to transitions in the input signal.

11. The half bridge circuit of claim 10, wherein the high side driver further comprises a DMOS transistor.

12. The half bridge circuit of claim 10, wherein the high side driver further comprises a driver having a reverse current conduction path when the driver is in the off condition.

13. The half bridge circuit of claim 10, wherein the circuitry configured to determine whether the frequency of a time varying input signal is greater than a predetermined threshold further comprises:
a transition counter for counting transitions in the input signal;
a timeframe counter for defining a timeframe that corresponds to a time period; and
circuitry adapted to determine if the transition counter exceeds a value greater than a first predetermined value during a timeframe and setting the fast state flag if the first predetermined value is exceeded.

14. The half bridge circuit of claim 13 and further comprising:
circuitry adapted to determine, if the fast state flag is set, whether the transition counter fails to reach a second predetermined value less than the first predetermined value during a first portion of a timeframe, and clearing the fast state flag if the second predetermined value is not met.

15. The half bridge circuit of claim 14 and further comprising:
circuitry adapted to determine, if the fast state flag is set, whether the transition counter fails to reach a third predetermined value greater than the second predetermined value during a second portion of a timeframe, and clearing the fast state flag if the second predetermined value is not met.

16. A method for controlling a half bridge circuit including a high side driver coupled between a positive voltage supply and an output terminal and having a reverse current conduction path, and a low side driver coupled between the output voltage supply and a ground reference, comprising:
determining whether a time varying input signal has a frequency that exceeds a predetermined threshold, and setting a fast state flag if the threshold is exceeded;
responsive to transitions in the input signal, outputting a low side driver gating signal to control the low side driver, the low side driver gating signal being an alternating signal of a first timing polarity;
if the fast state signal is set, outputting a value on a high side gating signal to control the high side driver to put the high side driver in an off condition; and
if the fast state signal is not set, responsive to transitions in the input signal outputting a high side driver gating signal to control the high side driver, the high side driver being an alternating signal of a second timing polarity.

17. The method of controlling a half bridge circuit of claim 16, wherein determining whether a time varying input signal has a frequency that exceeds a predetermined threshold further comprises:
defining a timeframe that is a time period;
counting transitions in the input signal during the timeframe;
determining if the input signal has more than a first predetermined number of transitions during the timeframe; and
if the predetermined number of transitions is exceeded, setting the fast state flag.

18. The method of claim 17, wherein counting transitions further comprises incrementing a counter.

19. The method of claim 18, and further comprising:
if the fast state flag is set, defining a timeframe that is a time period;
counting transitions in the input signal during a first portion of the timeframe; and
if the number of transitions is less than a second predetermined number of transitions that is less than the first predetermined threshold during the first portion, clearing the fast state flag.

20. The method of claim 19, and further comprising:
counting transitions in the input signal during a second portion of the timeframe; and
if the number of transitions is less than a third predetermined number of transitions that is greater than the second predetermined threshold during the second portion, clearing the fast state flag.

21. The method of claim 17, wherein defining a timeframe comprises providing a counter having a maximum value and incrementing the counter responsive to a clock input to reach the maximum value.

22. A half bridge controller integrated circuit, comprising:
circuitry adapted to output an alternating high side gating control signal of a first timing polarity for connection to a high side driver responsive to transitions in a time varying input signal;
circuitry adapted to output an alternating low side gating control signal for connection to a low side driver, the low side gating control signal of a second timing polarity opposite to the first timing polarity responsive to transition in the time varying input signal;
circuitry adapted to determine whether the frequency of the time varying input signal exceeds a threshold and setting a fast state flag if the threshold is exceeded;
circuitry adapted to inhibit the high side gating control signal if the fast state flag is set; and
circuitry adapted to enable the high side gating control signal if the fast state flag is not set.

23. The half bridge controller integrated circuit of claim 22, further comprising:
if the fast state flag is not set, circuitry adapted to delay the positive going transitions of the low side gating control signal with respect to the negative going transitions of the high side gating control signal, to prevent any overlap of the positive state of the low and high side gating control signals.

24. The half bridge controller integrated circuit of claim 22 wherein the predetermined threshold is 10 kHz.

25. The half bridge controller integrated circuit of claim 22 wherein the predetermined threshold is 20 kHz.

26. A method, comprising:
providing a high side DMOS driver coupled between a positive voltage supply and an output terminal for driving an inductive load, and having a high side gating control input;
providing a low side DMOS driver coupled between a ground voltage supply and the output terminal for driving an inductive load, and having a low side gating control input;
indicating an on/off switching mode when the frequency of the time varying input signal is below or equal a the predetermined threshold, and indicating a low side switching mode when the frequency of a time varying input signal above the predetermined threshold;

in the low side switching mode, outputting an alternating high and low signal on the low side gating control input of a first timing polarity responsive to transitions in the time varying input signal;

in the low side switching mode, inhibiting outputs on the high side gating control to maintain the high side gating control signal in an off condition;

in the on/off switching mode, outputting an alternating high and low signal on the low side gating control input of a first timing polarity responsive to transitions in the time varying input signal; and in the on/off switching mode, outputting an alternating high and low signal on the high side gating control input of a second timing polarity responsive to transitions in the time varying input signal.

27. The method of claim 26, wherein indicating an on/off switching mode when the frequency of the time varying input signal is below or equal to the predetermined threshold, and indicating a low side switching mode when the frequency of a time varying input signal is above the predetermined threshold further comprises defining a timeframe that is a time period;

counting transitions in the input signal during the timeframe;

determining if the input signal has more than a first predetermined number of transitions during the timeframe; and if the predetermined number of transitions is exceeded, indicating the low side switching mode; else indicating the on/off switching mode.

28. The method of claim 17, and further comprising:

if the low side switching mode is indicated, defining a timeframe that is a time period;

counting transitions in the input signal during a first portion of the timeframe; and if the number of transitions is less than a second predetermined number of transitions that is less than the first predetermined threshold during the first portion, indicating an on/off switching mode and ceasing indicating a low side switching mode.

29. The method of claim 19, and further comprising:

counting transitions in the input signal during a second portion of the timeframe; and if the number of transitions is less than a third predetermined number of transitions that is greater than the second predetermined threshold during the second portion, indicating an on/off switching mode and ceasing the indication of a low side switching mode.

30. An apparatus comprising:

means for driving a high side gating signal for a high side driver coupled between a positive power supply and an output terminal for an inductive load;

means for driving a low side gating signal for a low side driver coupled between the output terminal for the inductive load and a ground reference;

means for determining whether the frequency of a time varying input signal exceeds a predetermined threshold;

means for setting a fast state flag responsive to the means for determining;

means for enabling the means for driving a low side gating signal to output an alternating signal of a first timing polarity responsive to transitions in the input signal;

means for inhibiting the means for driving a high side gating signal if the fast state flag is set; and means for enabling the means for driving a high side gating signal if the fast state flag is not set, adapted to output an alternating signal of a second timing polarity opposite the first timing polarity responsive to transitions in the input signal.

31. The apparatus of claim 30 and further comprising:

first means for delaying the means for driving a low side gating signal if the fast state flag is not set;

second means for delaying the means for driving a high side gating signal if the fast state flag is not set; and means for bypassing the means for delaying the first and second means if the fast state signal is set.

* * * * *